(12) United States Patent
Brown

(10) Patent No.: US 7,410,856 B2
(45) Date of Patent: Aug. 12, 2008

(54) METHODS OF FORMING VERTICAL TRANSISTORS

(75) Inventor: Kris K. Brown, Garden City, ID (US)

(73) Assignee: Micron Technology, Inc., Boise, ID (US)

( * ) Notice: Subject to any disclaimer, the term of this patent is extended or adjusted under 35 U.S.C. 154(b) by 89 days.

(21) Appl. No.: 11/522,144

(22) Filed: Sep. 14, 2006

(65) Prior Publication Data

US 2008/0124867 A1    May 29, 2008

(51) Int. Cl.
H01L 21/8238    (2006.01)
(52) U.S. Cl. .................. 438/206; 438/206; 438/209; 438/36; 257/E21.375; 257/E21.41; 257/E21.629
(58) Field of Classification Search .............. 438/206, 438/209, 336; 257/E21.375, E21.41, E21.418, 257/E21.629, E2.643
See application file for complete search history.

(56) References Cited

U.S. PATENT DOCUMENTS

| | | | | |
|---|---|---|---|---|
| 4,746,960 A | * | 5/1988 | Valeri et al. ................. | 257/260 |
| 4,969,022 A | * | 11/1990 | Nishimoto et al. .......... | 257/301 |
| 6,392,271 B1 | | 5/2002 | Alavi et al. | |
| 6,580,137 B2 | * | 6/2003 | Parke ......................... | 257/401 |
| 6,632,723 B2 | | 10/2003 | Watanabe et al. | |
| 6,798,681 B2 | | 9/2004 | Ferrant et al. | |
| 6,818,937 B2 | | 11/2004 | Noble et al. | |
| 6,830,968 B1 | * | 12/2004 | Kim et al. .................... | 438/209 |
| 6,912,150 B2 | | 6/2005 | Portman et al. | |
| 7,120,046 B1 | * | 10/2006 | Forbes ......................... | 365/149 |
| 2005/0017240 A1 | | 1/2005 | Fazan | |
| 2005/0063224 A1 | | 3/2005 | Fazan et al. | |
| 2005/0133833 A1 | * | 6/2005 | Tsui ............................ | 257/288 |
| 2006/0101366 A1 | * | 5/2006 | Moldovan et al. ............. | 716/10 |

FOREIGN PATENT DOCUMENTS

| | | |
|---|---|---|
| EP | 1 271 547 A1 | 1/2003 |
| EP | 1 351 307 A1 | 10/2003 |

(Continued)

OTHER PUBLICATIONS

Kuo, et al., "A Capacitorless Double-Gate DRAM Cell Design for High Density Applications", IEEE, 2002, pp. 33.7.1-33.7.4.

*Primary Examiner*—Thanh Van Pham
(74) *Attorney, Agent, or Firm*—Wells St. John P.S.

(57) ABSTRACT

A vertical transistor forming method includes forming a first pillar above a first source/drain and between second and third pillars, providing a first recess between the first and second pillars and a wider second recess between the first and third pillars, forming a gate insulator over the first pillar, forming a front gate and back gate over opposing sidewalls of the first pillar by depositing a gate conductor material within the first and second recesses and etching the gate conductor material to substantially fill the first recess, forming the back gate, and only partially fill the second recess, forming the front gate, forming a second source/drain elevationally above the first source/drain, and providing a transistor channel in the first pillar. The channel is operationally associated with the first and second sources/drains and with the front and back gates to form a vertical transistor configured to exhibit a floating body effect.

22 Claims, 8 Drawing Sheets

FOREIGN PATENT DOCUMENTS

| | | |
|---|---|---|
| EP | 1 355 316 A1 | 10/2003 |
| EP | 1 355 317 A1 | 10/2003 |
| EP | 1 355 357 A1 | 10/2003 |
| WO | WO 02/103703 A2 | 12/2002 |
| WO | WO 03/088255 A1 | 10/2003 |
| WO | WO 03/088322 A2 | 10/2003 |

* cited by examiner

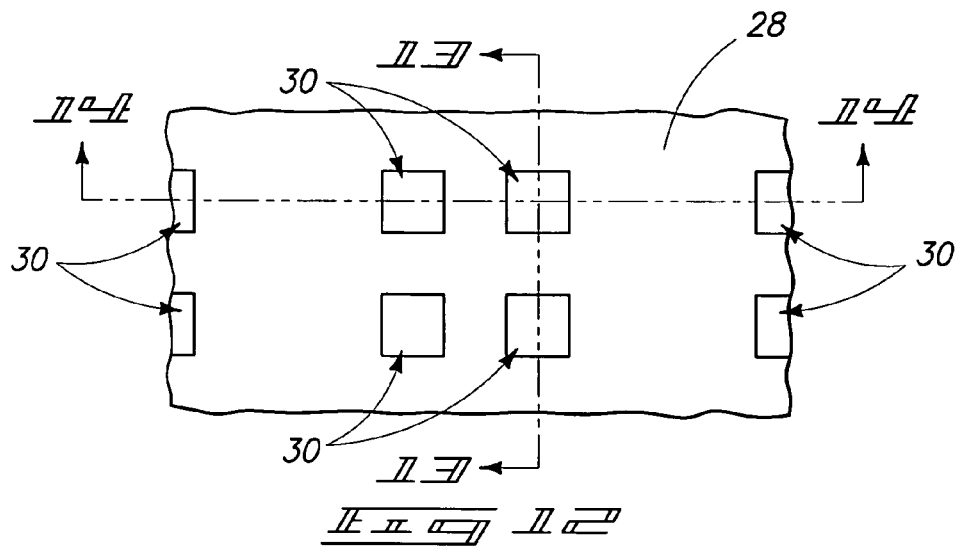
_Fig. 12_
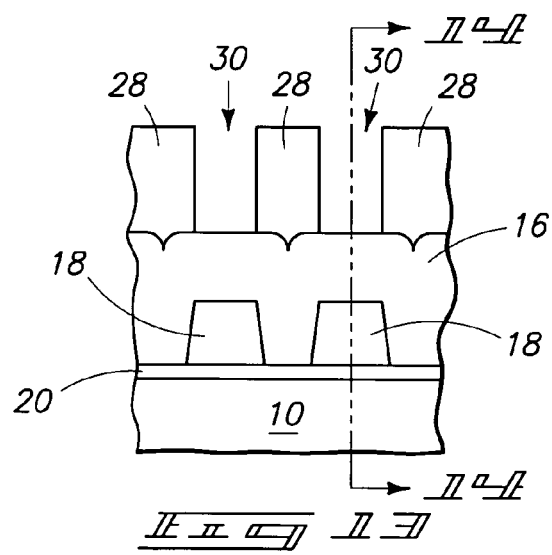
_Fig. 13_
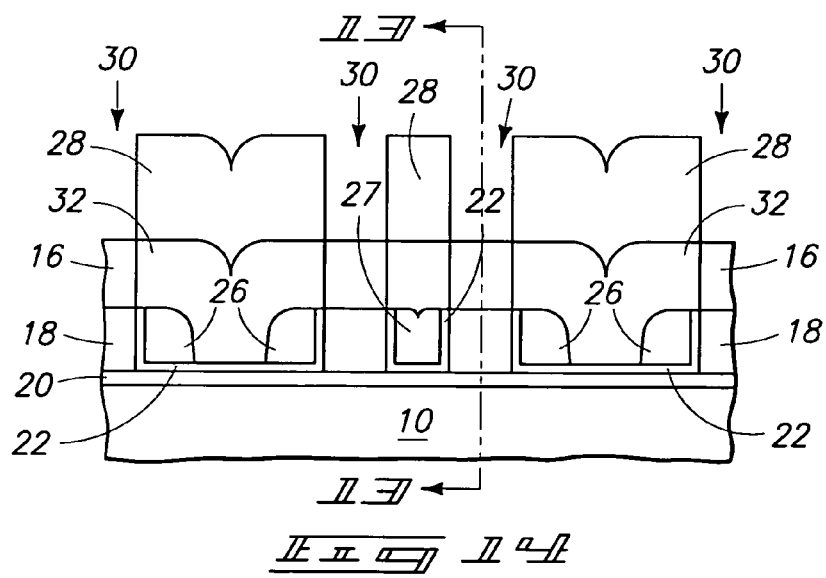
_Fig. 14_

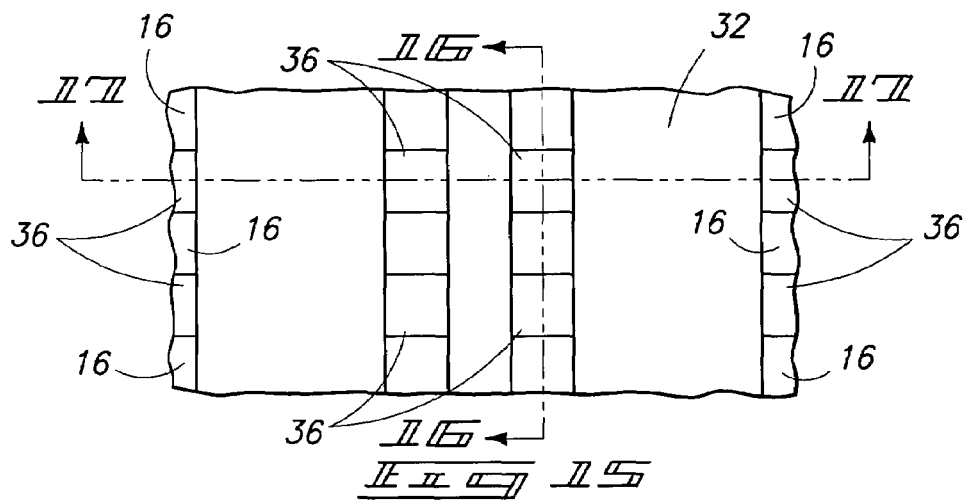
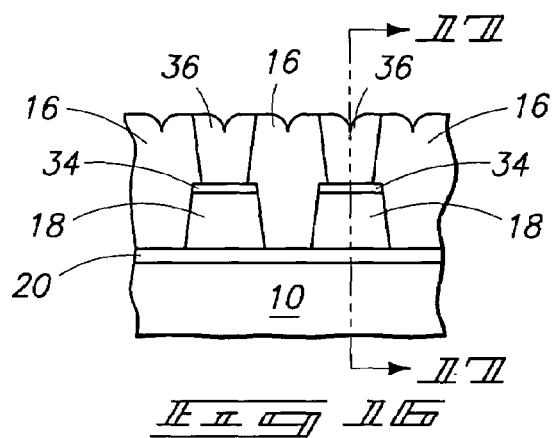
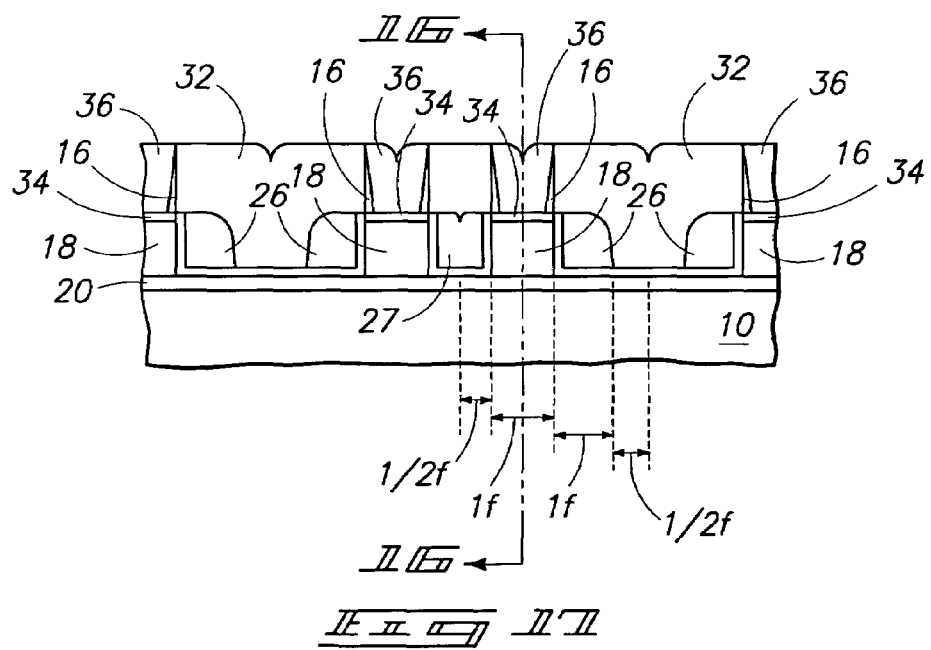

ent invention.# METHODS OF FORMING VERTICAL TRANSISTORS

TECHNICAL FIELD

The invention pertains to methods of forming vertical transistors, including those configured to exhibit a floating body effect.

BACKGROUND OF THE INVENTION

Along with continuing efforts to improve data access speed and decrease power consumption in dynamic random access memory (DRAM), capacitorless memory technologies emerged as an area of interest. Corresponding desires to scale down memory devices created doubt regarding whether the standard one transistor/one capacitor cell design may provide the desired progress. Capacitorless memory relies upon the floating body effect of field effect transistors instead of a storage capacitor to provide a memory cell. Kuo, et al., "A Capacitorless Double-Gate DRAM Cell Design for High Density Applications," IEEE Int'l Electron Devices Meeting (IEDM) Tech. Dig., 2002, pages 843-846 as well as U.S. Pat. No. 6,632,723 issued Oct. 14, 2003 to Watanabe et al. (hereinafter, Watanabe) describe use of capacitorless memory cells exhibiting a "floating body effect." Implementing capacitorless memory cells in DRAM may involve using sense amplifier circuitry known to those of ordinary skill. The sense amplifier may use a cross-coupled differential amplifier, which measures the current level into the cell. The differential amplifier may use the current into the amplifier from the cell as one input and a reference current as another input. The current setting of the reference may be determined by statistics and programmed at probe. The output of the sense amplifier may be a standard binary signal (1-0). The floating body cell is not a destructive read and does not require a refresh of the cell at the time of read. Refresh can be chosen at a convenient time for the circuit.

Given the structural complexity of conventional transistors that use a floating body effect in memory cells, numerous photomasks may be involved to produce a suitable device. For example, Watanabe implies formation of the device shown in Figs. 33A-33B as involving no fewer than six photomasks. In the context of the present document, a "photomask" is formed in a photolithographic process typically involving forming a photoresist on a surface, exposing the photoresist, and developing the photoresist to remove selected portions, thus, forming a photomask. After forming a photomask, the surface exposed through openings in the photomask may be etched. Forming a photomask can involve a time and cost intensive process, prompting a desire to reduce the number of photomasks in methods that produce transistors exhibiting a floating body effect, for example, in capacitorless memory devices.

BRIEF DESCRIPTION OF THE DRAWINGS

Preferred embodiments of the invention are described below with reference to the following accompanying drawings.

FIGS. 12-14 are, respectively, a top view and sectional views taken along lines 14-14 and 13-13 in FIG. 12 of a semiconductor substrate fragment at a processing step subsequent to that shown in FIGS. 9-11.

FIGS. 15-17 are, respectively, a top view and sectional views taken along lines 17-17 and 16-16 in FIG. 15 of a semiconductor substrate fragment at a processing step subsequent to that shown in FIGS. 12-14.

DETAILED DESCRIPTION OF THE PREFERRED EMBODIMENTS

Figure 1:
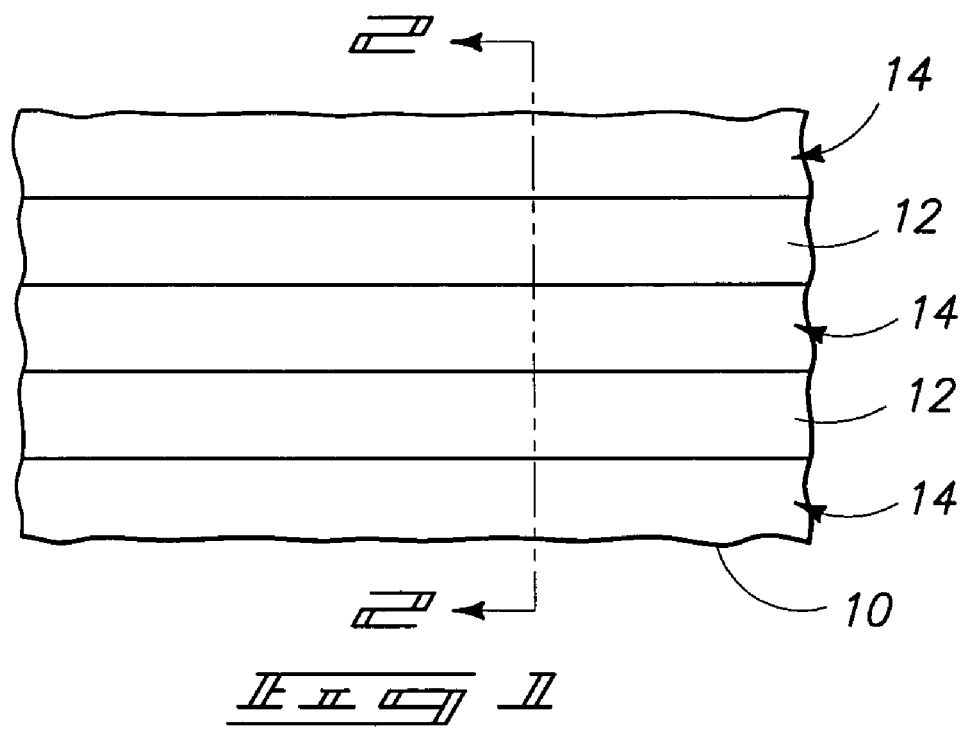
FIGS. 1 and 2 are, respectively, a top view and a sectional view taken along line 2-2 in FIG. 1 of a semiconductor substrate fragment at one processing step in accordance with an embodiment of the invention.

Observation and study indicates that vertical transistors configured to exhibit a floating body effect show promise as a device allowing improvements in data access speed and reduced power consumption while further providing a reduced number of photomasks. While not being limited to use in memory devices, such vertical transistors may allow scaling not otherwise obtainable with the standard one transistor/one capacitor cell design of conventional memory devices, for example, DRAM.

According to one embodiment of the invention, a vertical transistor forming method includes forming a first semiconductive pillar elevationally above a first transistor source/drain in a semiconductive substrate and laterally between a second semiconductive pillar and a third semiconductive pillar. The first pillar is closer to the second pillar than to the third pillar, thus, providing a first recess between the first and second pillars and a wider second recess between the first and third pillars. The method includes forming a gate insulator over opposing sidewalls of the first pillar within the first and second recesses. A transistor front gate and a transistor back gate are formed over the gate insulator and over respective opposing sidewalls of the first pillar by depositing a gate conductor material within the first and second recesses and etching the gate conductor material. The gate conductor material is etched in a manner such that residual gate conductor material substantially fills the first recess, forming the back gate, and only partially fills the second recess, forming the front gate. Element isolation material is formed within the second recess between the front gate and the third pillar and elevationally above the front gate and the back gate. The method includes forming a second transistor source/drain elevationally above the first source/drain. A transistor channel is provided in the first pillar, the channel being operationally associated with the first and second sources/drains and with the front and back gates to form a vertical transistor configured to exhibit a floating body effect.

Methods such as those described in the embodiments of the invention that include depositing gate conductor material within recesses of a semiconductor substrate and etching the gate conductor material to form front and back gates may allow elimination of a conventional photomask used to form front and back gates. By way of example, the deposit and etch processing may include blanket deposition of a polysilicon gate conductor material as a conformal layer within recesses followed by anisotropic etching of the conformal layer. The anisotropic etching may be conducted to leave residual material along sidewalls of recesses in the semiconductive substrate in the shape of what is commonly referred to as a "sidewall spacer." As will be appreciated from the further discussion below, selection of recess dimensions and conformal layer thickness, along with etching conditions, may provide front and back gates of suitable size and functionality without requiring a photomask.

Further, by way of example, forming the gate insulator may include growing an oxide on the opposing sidewalls of the pillar and on the substrate. If desired, forming the gate insulator may be preceded by providing element isolation material elevationally above the pillar in a manner that prevents oxide growth elevationally above the pillar. That is, oxide growth may be limited to the certain sidewalls of the first pillar and other areas where desired. The element isolation material formed before the oxide growth may, for example, include an oxide-containing material, such as silicon dioxide.

Accordingly, the method may further involve providing a third recess between the first pillar and an adjacent fourth semiconductive pillar and providing an oxide-containing initial element isolation material elevationally above the pillar and within the third recess. The gate insulator may then be formed over the opposing sidewalls of the first pillar, but not elevationally above the first pillar by leaving the initial element isolation in place. Formation of subsequent element isolation material containing a nitride may occur. The method in the present embodiment of the invention may thus include forming nitride-containing element isolation material within the second recess between the front gate and the third pillar and elevationally above the front gate and the back gate.

With the oxide-containing initial element isolation material elevationally above the first pillar, and the nitride-containing element isolation material in place, such configuration may allow forming a self-aligned contact opening through the initial element isolation above the pillar. The opening may expose a portion of the pillar. One example of a process to form the self-aligned contact (SAC) includes using oxide-selective etching techniques known to those of ordinary skill. It may be particularly advantageous for the vertical transistor forming method to further include forming an array of capacitorless memory cells including the vertical transistor.

Figure 2:
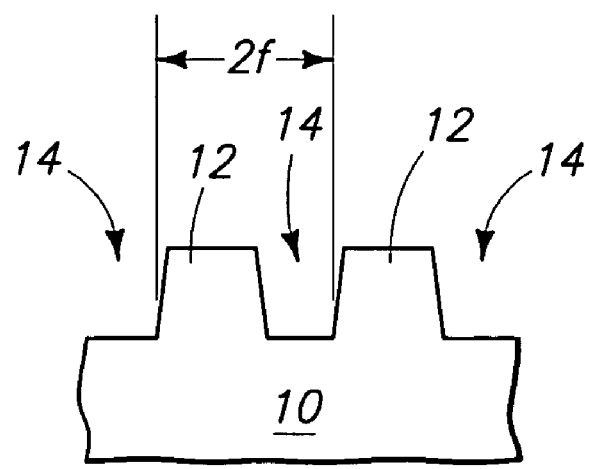

Depositing and etching the gate conductor material may be conducted using conventional methods known to those of ordinary skill. However, the particular configuration of vertical transistor front and back gates formed in recesses over a semiconductive pillar and substantially filling a first recess but only partially filling the second recess may provide particular advantages that will be appreciated from the accompanying Figures. FIGS. 1 and 2 show a substrate 10 after forming a photomask, etching substrate 10 to form isolation trenches 14 between alternating lines of active area 12, and removing the photomask. FIG. 1 is a top view of substrate 10 and FIG. 2 is a sectional view taken along line 2-2. Where "f" is the feature size, one dimension of a memory cell incorporating active area 12 may have a size of 2 f, as shown in the lateral direction of FIG. 2.

Figure 3:
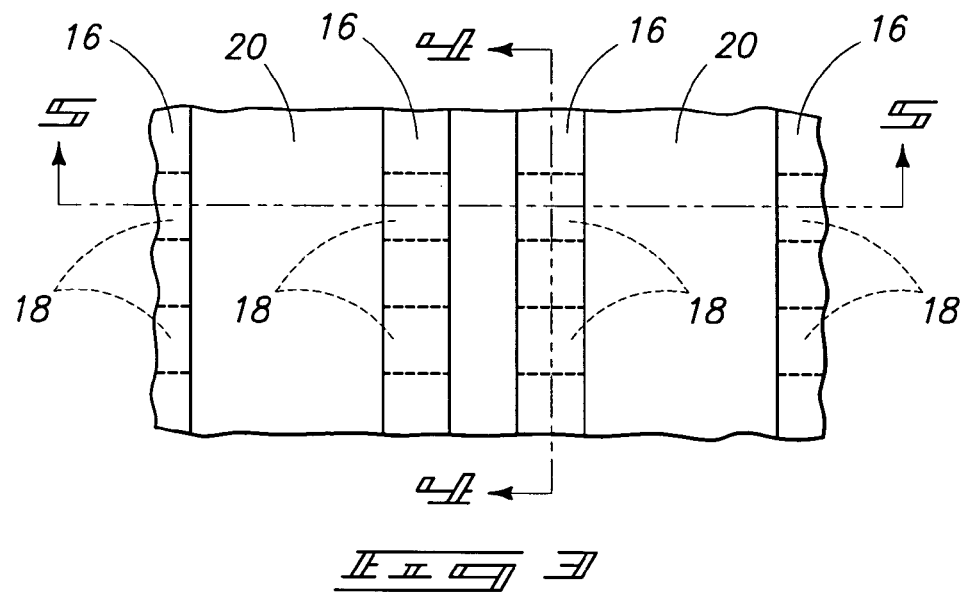
FIGS. 3-5 are, respectively, a top view and sectional views taken along lines 5-5 and 4-4 in FIG. 3 of a semiconductor substrate fragment at a processing step subsequent to that shown in FIGS. 1 and 2.
Figure 4:
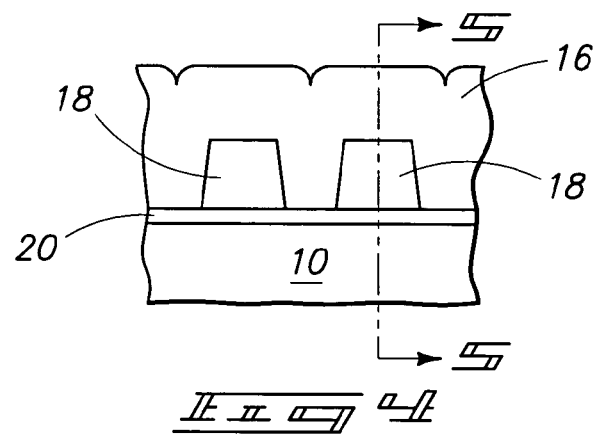
Figure 5:
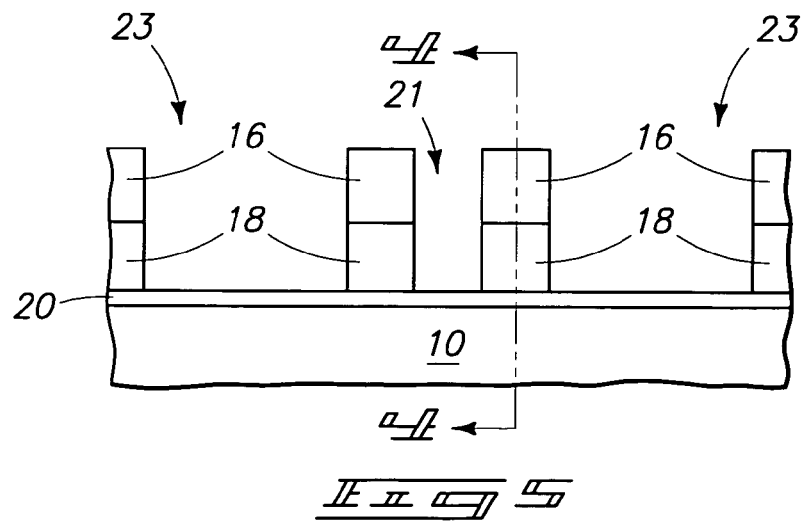

FIGS. 3-5 show a top view and respective sectional views taken along lines 5-5 and 4-4 shown in FIG. 3 of substrate 10 after subsequent processing. The processing included forming a conformal layer of element isolation material, forming a photomask, and etching the element isolation material and active areas 12 to leave element isolation 16 elevationally above pillars 18. The etching forms recess 21 and recesses 23 between pillars 18. Recess 21, recesses 23, and isolation trenches 14 may have depths of from 0.1 to 0.25 micrometer ($\mu$m). The etching may occur by any process known to those of ordinary skill as capable of removing unmasked portions of element isolation material, for example silicon dioxide, as well as substrate 10 in active areas 12, for example monocrystalline silicon. An oxide etch selective to nitride (such as a self-aligned contact etch) may be suitable, for example, $CHF_3+C_2F_6+Ar+CF_4$ chemistry employed in a reactive ion etching reactor. The process may involve one or more etching steps. For example, a first etch may be used for removing unmasked portions of element isolation material followed by a second etch to remove unmasked portions of substrate 10. Once it is patterned, element isolation 16 shown in FIGS. 3-5 may essentially function as a mask while recessing active areas 12 to form recess 21 and recesses 23.

FIGS. 3-5 show a common source/drain region 20 in substrate 10. A variety of techniques known to those of ordinary skill may be used to form common source/drain region 20. Such techniques may be implemented at a variety of points within the vertical transistor forming method. It may be most advantageous for a common source/drain implant to occur before removing portions of substrate 10 to form isolation trenches 14. However, techniques exist for implanting at other process steps followed by sufficient annealing to drive dopant laterally beneath any structures masking the array-wide implant. For example, the implant may occur after forming pillars 18 and element isolation 16 shown in FIGS. 3-5. Common source/drain region 20 may most advantageously be N+ doped and function as a transistor common source.

Figure 6:
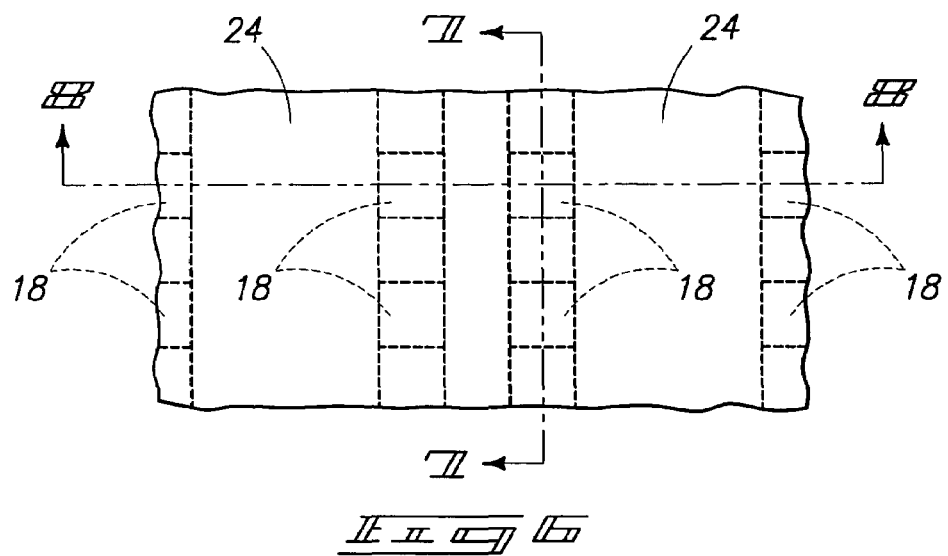
FIGS. 6-8 are, respectively, a top view and sectional views taken along lines 7-7 and 8-8 in FIG. 6 of a semiconductor substrate fragment at a processing step subsequent to that shown in FIGS. 3-5.
Figure 7:
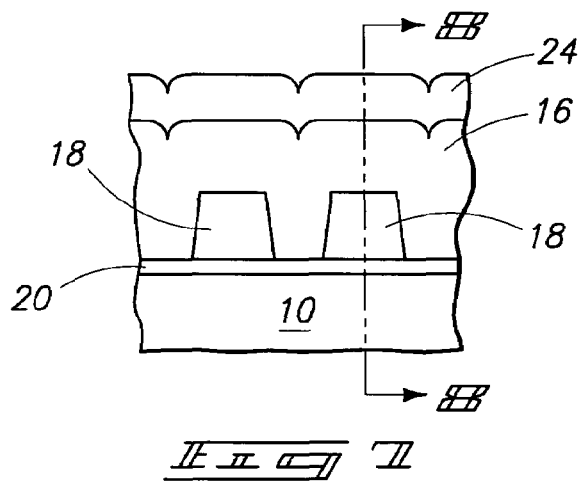
Figure 8:
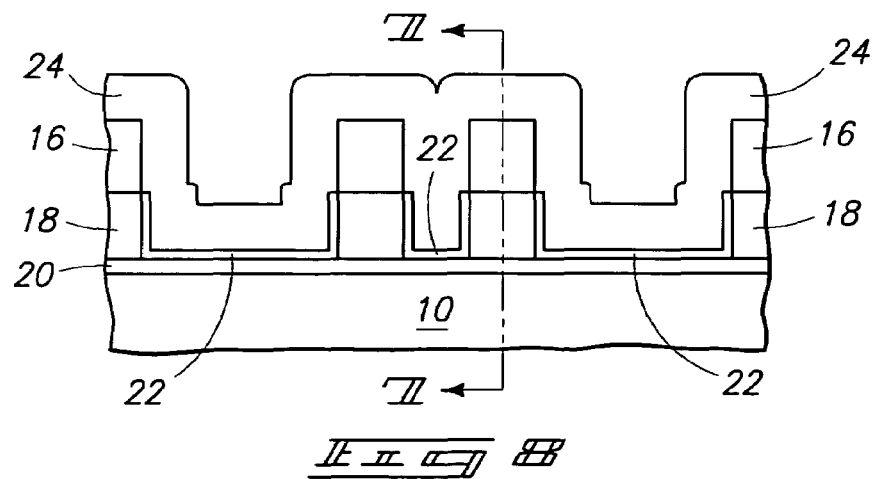

FIGS. 6-8 provide a top view and respective sectional views taken along lines 8-8 and 7-7 after forming a gate insulator 22 and a blanket deposited a conformal layer of gate conductor material 24. Gate conductor material 24 may contain polysilicon. The conformal layer may have a pre-etching thickness that approximately equals a distance between the first and second pillar, i.e., that approximately corresponds to feature size "f". Any variety of techniques known to those of ordinary skill may be used to form gate insulator 22 in appropriate locations and thicknesses to provide the desired features. One technique known to be suitable involves growing an oxide on exposed semiconductor surfaces. In the circumstance where substrate 10 is silicon, a silicon oxide gate insulator may be grown.

FIGS. 6-8 show gate insulator 22 formed over opposing sidewalls of pillars 18 within recess 21 and recesses 23 and over the bottoms of recess 21 and recesses 23. Accordingly, since common source/drain region 20 forms the bottom of recess 21 and recesses 23, gate insulator 22 separates gate conductor material 24 from pillars 18 as wells as from common source/drain region 20. Other opposing sides of pillars 18 in FIG. 7 do not show formation of gate insulator 22 thereon since such sidewalls are protected by element isolation 16. Element isolation 16 on top of pillars 18 and between pillars 18 in FIG. 7 allows formation of gate insulator 22 without the need for a subsequent photomask and etching if gate insulator material were instead blanket deposited (not shown) over pillars 18.

Figure 9:
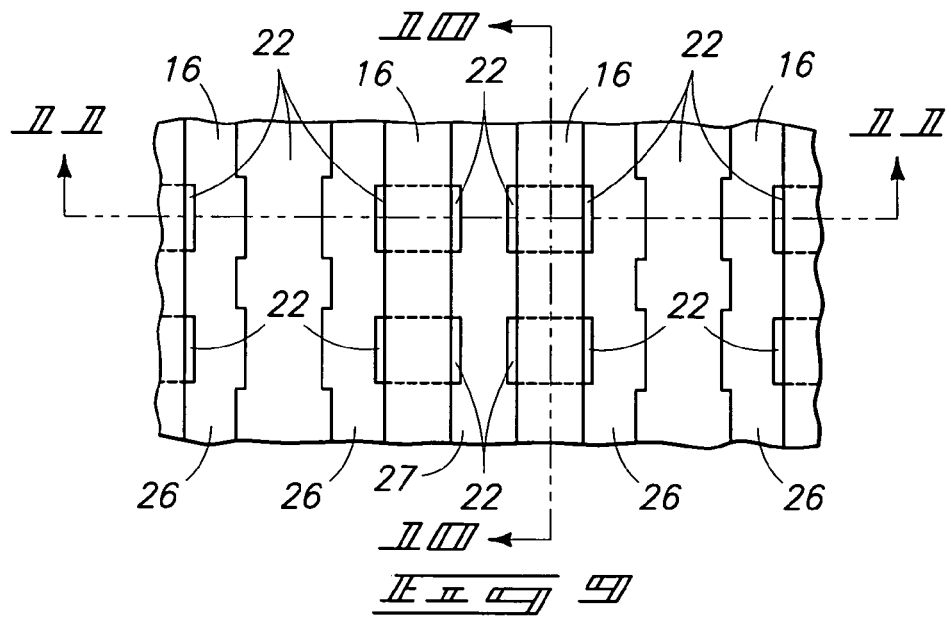
FIGS. 9-11 are, respectively, a top view and sectional views taken along lines 11-11 and 10-10 in FIG. 9 of a semiconductor substrate fragment at a processing step subsequent to that shown in FIGS. 6-8.
Figure 10:
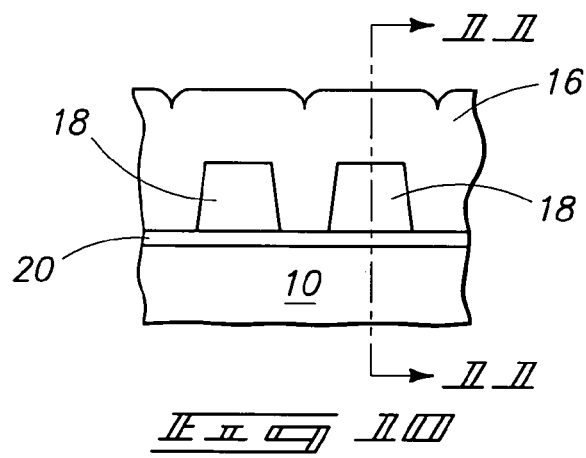
Figure 11:
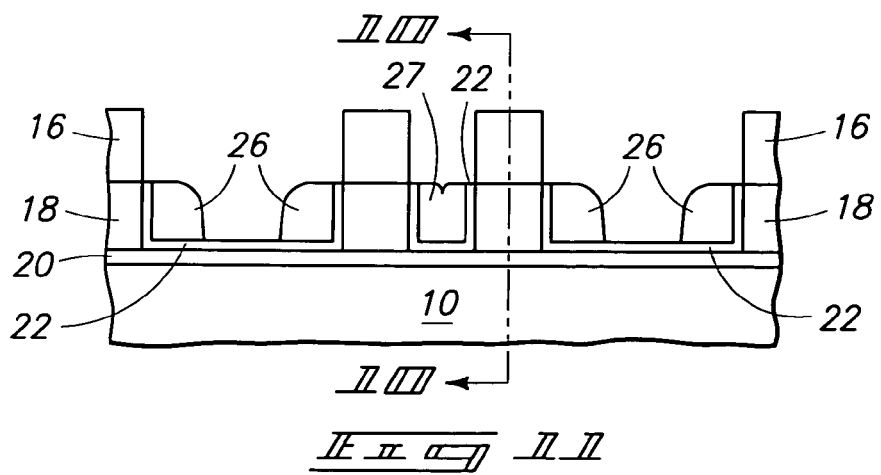

FIGS. 9-11 show a top view and respective sectional views taken along lines 11-11 and 10-10 after etching gate conductor material 24 in a manner such that residual gate material substantially fills the portion of recess 21 formed in substrate 10 between pillars 18 and only partially fills the portion of recess 23 formed in substrate 10 between pillars 18. Gate conductor material 24 is removed from the portion of recess 21 and recesses 23 formed in element isolation 16. Residual material provides front gates and back gates for each of pillars 18 in the form of front word lines 26 and back word lines 27. It is apparent that back word line 27 is shared between two of pillars 18 shown in FIG. 11 while each of the four pillars 18 shown in FIG. 11 are provided with their own front word line 26. Anisotropic etching may be appreciated from FIGS. 8 and 11 to remove gate conductor material 24 leaving residual portions in the form of "sidewall spacer" type of structures as front word lines 26.

FIGS. 12-14 show a top view and respective sectional views taken along lines 14-14 and 13-13 after forming element isolation 32 between front word lines 26 within recess 21 and recesses 23 and elevationally above both front word lines 26 and back word line 27. Such may be accomplished by, among other possible methods, deposition of a conformal layer of insulative material followed by etching back to a point sufficient to expose element isolation 16. Such processing essentially fills recesses between pillars 18 and isolation material 16 shown in FIGS. 9-11. One example of a suitable etch process to remove element isolation material formed as a nitride when element isolation 16 is formed as an oxide includes a hot phosphoric acid etch. Such a technique may be timed to remove a thickness of nitride-containing element isolation material elevationally above element isolation 16 down to the point where element isolation 16 is exposed and provide the elevational levels of element isolation 32 and element isolation 16 shown in FIG. 14.

FIGS. 12-14 also show photomask 28 after forming photoresist over substrate 10, exposing, and developing to provide openings 30 in regions where contacts to pillars 18 are desired. Subsequent removal of elemental isolation 16 may be conducted in a self-aligned manner in the lateral direction shown in FIG. 14 by removing element isolation 16 selectively with respect to element isolation 32. However, such selective removing might not occur in a self-aligned manner in the lateral direction shown in FIG. 13 since any misalignment of openings 30 in the lateral direction of FIG. 13 would merely expose other portions of element isolation 16. In contrast, misalignment of openings 30 in the lateral direction of FIG. 14 would expose element isolation 32 that would not be removed.

FIGS. 15-17 show a top view and respective sectional views taken along lines 17-17 and 16-16 after forming contact openings through element isolation 16, forming source/drain regions 34 in pillars 18 elevationally above common source/drain region 20, and forming source/drain contacts 36 to pillars 18. FIGS. 16 and 17 show contact openings through element isolation 16 with angled sidewalls, as would be expected for oxide-selective etching of silicon dioxide. However, since element isolation 16 may contain other materials and/or different removal techniques may be used, sidewalls may be at other angles. Conventional techniques for forming (for example, implanting) source/drain regions 34 may be used. Source/drain regions 34 may most advantageously be N+ doped and function as a transistor drains. Source/drain contacts 36 may be formed by removing photomask 28, blanket depositing a conformal layer of conductive material filling openings through element isolation 16, and etching back to reveal element isolation 32. In such a process, no additional photomask is needed. Residual conductive material will remain as source/drain contacts 36. Alternatively, some other technique may be used to form source/drain contacts 36 with photomask 28 still in place or with a different photomask in place. For example, conventional dual damascene techniques may be used to pattern digit line routes and then to deposit conductive material for digit lines and source/drain contacts at the same time.

Notably, FIG. 17 shows a 3 f cell dimension in the lateral direction of FIG. 17. Combined with the 2 f cell dimension shown in FIG. 4, a 6 f$^2$ cell area results. Accordingly, FIG. 15 shows four complete cells along with front word lines 26 and part of pillars 18 for four partial cells. FIG. 17 shows gate insulator 22 and back word line 27 formed in recess 21 as having a dimension of 1 f. Gate insulator 22 and front word lines 26 formed in recesses 23 also have individual dimensions of 1 f. The feature size of recess 21, corresponding to a dimension of 1 f, results from the photomask used to form recess 21. In contrast, the size of front word lines 26 and gate insulator 22 having a dimension of 1 f results from selecting a thickness of gate insulator 22 and gate conductor material 24 shown in FIG. 8 and etching conditions to produce the desired dimension.

If gate conductor material 24 has a pre-etching thickness that approximately equals the distance formed by recess 21 between pillars 18 (i.e., 1 f), then conventional anisotropic etching may leave a residue of gate conductor material 24 as front word lines 26 with the desired dimension. Understandably, the 1 f dimension shown in FIG. 17 for front word lines 26 and gate insulator 22 includes the thickness of gate insulator 22 as well. However, the thickness of gate insulator 22 is exaggerated in the Figures for ease in viewing. Normally, gate insulator has a thickness of from 40 to 50 Angstroms. Front word lines 26 may have a much larger thickness in the lateral direction of FIG. 17 of from 50 to 100 Angstroms. Also, anisotropically etching gate conductor material 24 may somewhat reduce thickness, roughly accounting for the additional gate insulator 22 thickness so that approximately a 1 f dimension is achieved.

FIGS. 15-17 thus reveal a transistor channel operationally associated with source/drain region 34 and common source/drain region 20 and with front word lines 26 and back word line 27. The vertical transistor thus formed is configured to exhibit a floating body effect. The portion of pillars 18 functioning as a transistor channel may be doped or undoped, however, one advantage of the structures shown in FIGS. 15-17 includes operating with the transistor body fully depleted, thus, avoiding additional doping of the transistor channel. Review of the above described processes associated with FIGS. 1-17 reveals that only three photomasks were used. The structural configuration and elimination of a photomask, at least in forming word lines, allows simplification of the process and reduction in cost of manufacturing.

It is an advantage of the resulting vertical transistor shown in FIGS. 15-17 that array connections may be formed above or below the cells. For example, interlayer dielectric material (ILD) may be formed over element isolation 32 and source/drain contacts 36 followed by forming a photomask and patterning digit line routes in the ILD. Alternatively, a photomask may be formed and digit line routes patterned within substrate 10 in a buried configuration. Strapping, as conventionally utilized with buried digit lines, may be provided above the transistors of FIGS. 15-17 with appropriate contacts to the buried digit lines. In the event of using a buried digit line configuration, individual source/drain regions may be formed in substrate 10 instead of common source/drain region 20 and digit line contacts may be made to the elevationally lower, rather than higher, source/drain region.

According to another embodiment of the invention, a vertical transistor forming method includes forming first, second, and third linearly aligned semiconductor pillars by etching a monocrystalline silicon substrate. The first pillar is elevationally above a common first N+ transistor source/drain in the substrate and laterally between the second pillar and the third pillar. The first pillar is closer to the second pillar than to the third pillar, thus providing a first recess between the first and second pillars and a wider second recess between the first and third pillars with the common first source/drain forming bottoms of the first and second recesses. The etching also provides a fourth pillar adjacent the first pillar in a direction perpendicular to the linear alignment. A third recess exists between the first and fourth pillars. An oxide-containing element isolation material is formed elevationally above the pillar and within the third recess. A gate insulator is formed over opposing sidewalls of the first pillar within the first and second recesses and over the bottoms of the first and second recesses. The gate insulator is not formed elevationally above the first pillar, by leaving the oxide-containing isolation in place.

The method includes forming a transistor front gate and a transistor back gate over the gate insulator and over respective opposing sidewalls of the first pillar by blanket depositing a conformal layer of gate material within the first and second recesses. The method includes anisotropically etching the gate material such that residual gate material substantially fills the first recess, forming the back gate. The etched gate material only partially fills the second recess, forming the front gate. The conformal layer has a pre-etching thickness that approximately equals a distance between the first and second pillar. Any exposed portion of the front gate and the back gate is covered with nitride-containing element isolation material formed within the second recess between the front gate and the third pillar. Nitride-containing element isolation material is also formed elevationally above the front gate and the back gate. Using oxide-selective etching, a self-aligned contact opening is formed through the oxide-containing isolation above the pillar. The opening exposes a portion of the first pillar. The method includes forming a second N+ transistor source/drain elevationally above the first source/drain, providing a transistor channel in the first pillar. The channel is operationally associated with the first and second sources/drains and with the front and back gates to form a vertical transistor configured to exhibit a floating body effect.

By way of example, forming the gate insulator may include growing an oxide on the opposing sidewalls of the pillar and on the first source/drain within the first and second recesses. The method may further include forming a front word line and a back word line respectively including the front gate and the back gate. The front and back word lines may operationally extend to other similarly formed vertical transistors in an array of transistors. Also, the method may further include forming another similarly formed vertical transistor including the second pillar, where the vertical transistor and the other vertical transistor share the back gate.

Figure 18:
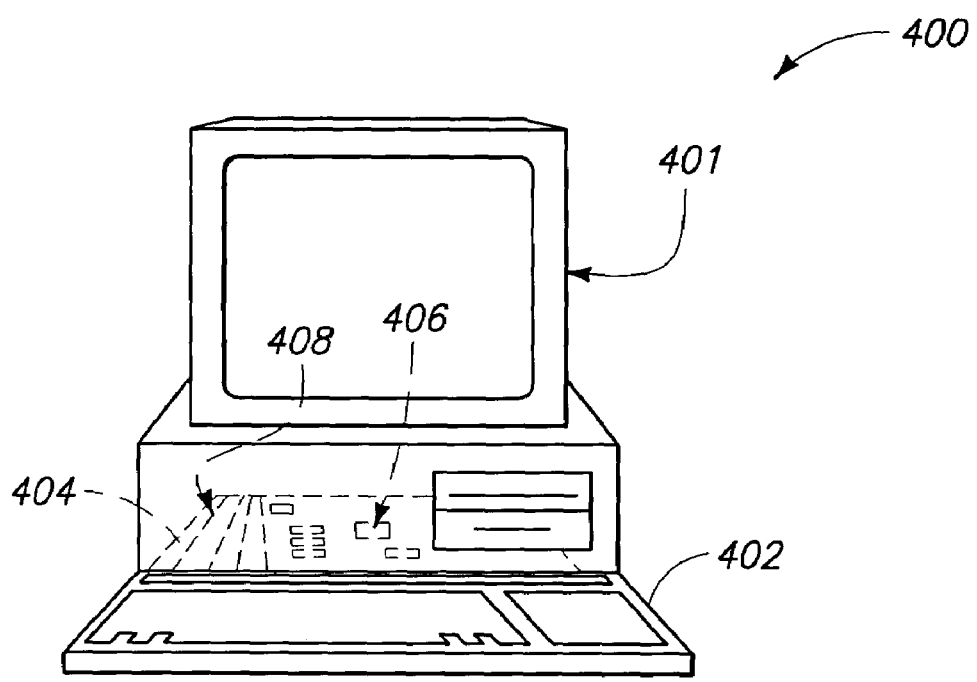
FIG. 18 is a diagrammatic view of a computer illustrating an example application of the present invention.
Figure 19:
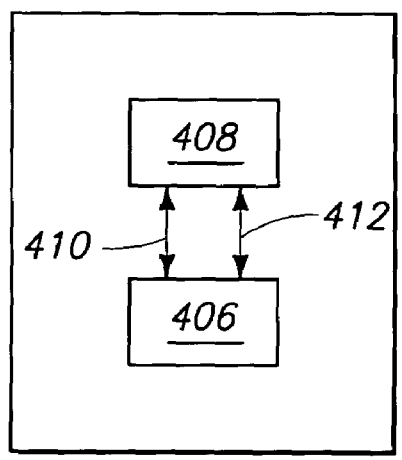
FIG. 19 is a block diagram showing particular features of the motherboard of the FIG. 18 computer.

FIG. 18 illustrates generally, by way of example, but not by way of limitation, a computer system 400 according to an embodiment of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various embodiments of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 19. In such block diagram, the addressing circuitry is illustrated as 410 and the read circuitry is illustrated as 412.

In particular embodiments of the invention, memory device 408 can correspond to a memory module. For example, single in-line memory modules (SIMMs) and dual in-line memory modules (DIMMs) may be used in the implementation that utilizes the teachings of the present invention. The memory device can be incorporated into any of a variety of designs that provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory that allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Figure 20:
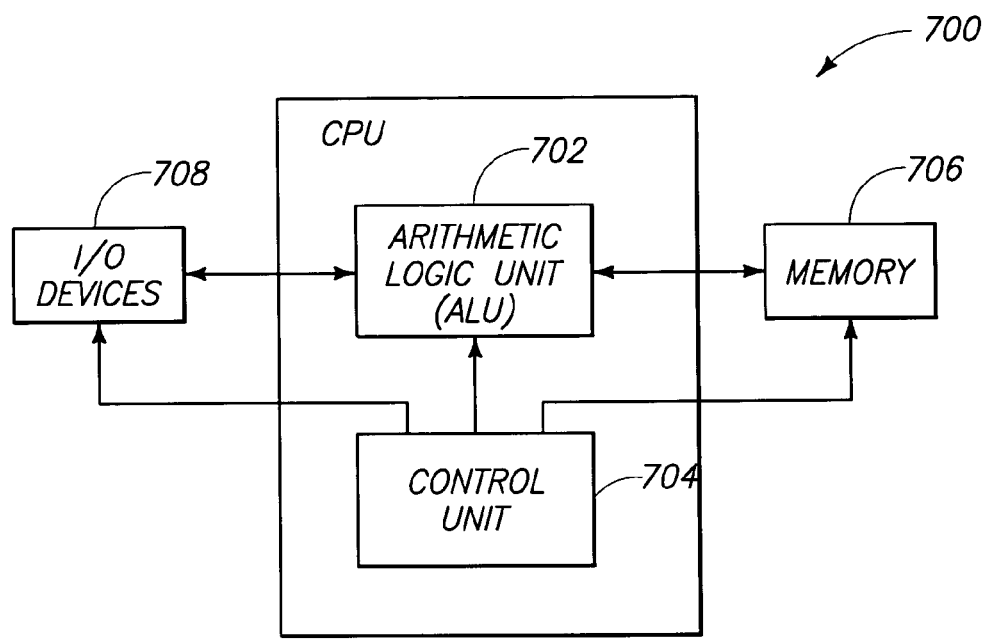
FIG. 20 is a high level block diagram of an electronic system according to an embodiment of the present invention.

FIG. 20 illustrates a simplified block diagram of a high-level organization of various embodiments of an example electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include DRAM cells in accordance with various embodiments of the present invention.

Figure 21:
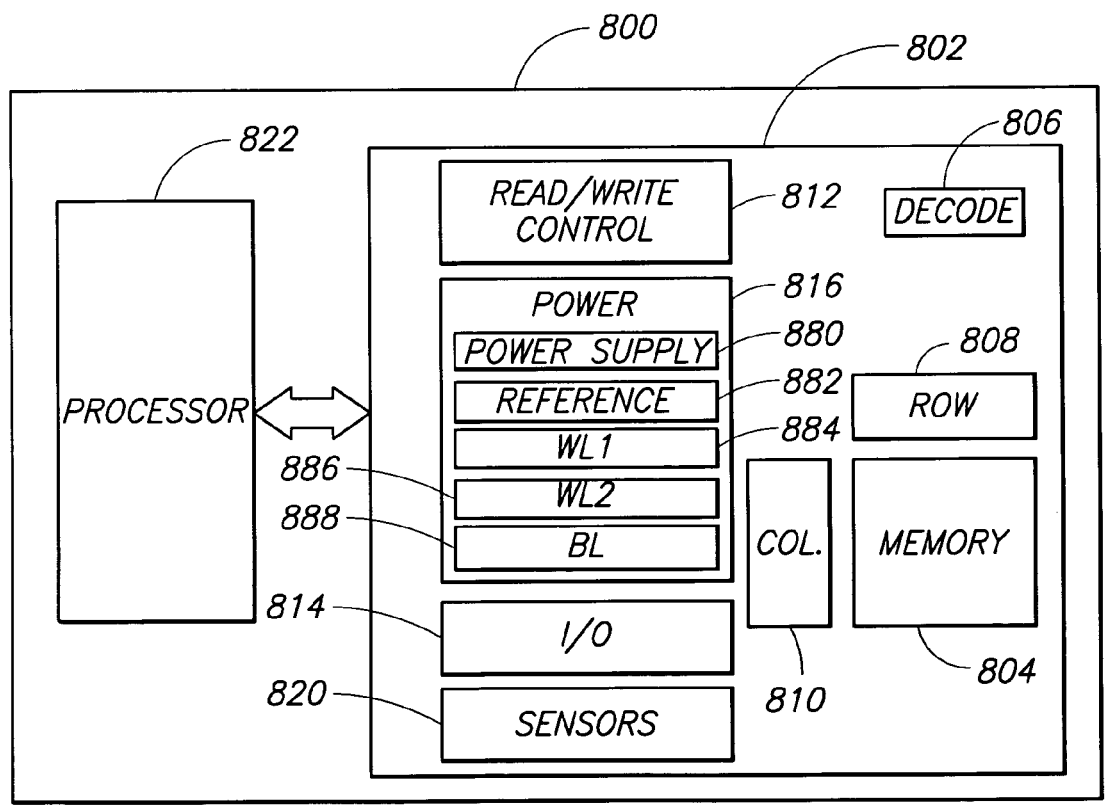
FIG. 21 is a simplified block diagram of an example memory device according to an embodiment of the present invention.

FIG. 21 is a simplified block diagram of a high-level organization of various embodiments of an example electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first word line with pulses, circuitry 886 for providing the second word line with pulses, and circuitry 888 for providing the bitline with pulses. The system 800 also includes a processor 822, or memory controller for memory accessing.

The memory device 802 receives control signals 824 from the processor 822 over wiring or metallization lines. The memory device 802 is used to store data that is accessed via I/O lines. It will be appreciated by those skilled in the art that additional circuitry and control signals can be provided, and that the memory device 802 has been simplified to help focus on the invention. At least one of the processor 822 or memory device 802 can include a capacitor construction in a memory device of the type described previously herein.

The various illustrated systems of this disclosure are intended to provide a general understanding of various applications for the circuitry and structures of the present invention, and are not intended to serve as a complete description of all the elements and features of an electronic system using memory cells in accordance with embodiments of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

I claim:

1. A method of forming a vertical transistor comprising:
   forming a first semiconductive pillar elevationally above a first transistor source/drain in a semiconductive substrate and laterally between a second semiconductive pillar and a third semiconductive pillar, the first pillar being closer to the second pillar than to the third pillar, thus, providing a first recess between the first and second pillars and a wider second recess between the first and third pillars;
   forming a gate insulator over opposing sidewalls of the first pillar within the first and second recesses;
   forming a transistor front gate and a transistor back gate over the gate insulator and over respective opposing sidewalls of the first pillar by depositing a gate conductor material within the first and second recesses and etching the gate conductor material in a manner such that residual gate conductor material substantially fills the first recess, forming the back gate, and only partially fills the second recess, forming the front gate;
   forming element isolation material within the second recess between the front gate and the third pillar and elevationally above the front gate and the back gate; and
   forming a second transistor source/drain elevationally above the first source/drain and providing a transistor channel in the first pillar, the channel being operationally associated with the first and second sources/drains and with the front and back gates to form a vertical transistor configured to exhibit a floating body effect.

2. The method of claim 1 wherein forming the gate insulator comprises growing an oxide on the opposing sidewalls of the pillar and on the substrate.

3. The method of claim 2 wherein forming the gate insulator is preceded by providing element isolation material elevationally above the pillar in a manner that prevents oxide growth elevationally above the pillar.

4. The method of claim 1 wherein the element isolation material comprises a nitride.

5. The method of claim 1 further comprising:
   providing a third recess between the first pillar and an adjacent fourth semiconductive pillar;
   providing an oxide-containing initial element isolation material elevationally above the first pillar and within the third recess; and
   forming the gate insulator over the opposing sidewalls of the first pillar, but not elevationally above the first pillar, by leaving the initial element isolation in place.

6. The method of claim 5 further comprising forming a self-aligned contact opening through the initial element isolation above the first pillar, the opening exposing a portion of the first pillar.

7. The method of claim 1 wherein etching the gate conductor material comprises anisotropic etching.

8. The method of claim 1 further comprising forming an array of capacitorless memory cells including the vertical transistor.

9. The method of claim 8 further comprising forming a computer system including the memory cells.

10. A method of forming a vertical transistor comprising:
    forming a first semiconductive pillar elevationally above a first transistor source/drain in a semiconductive substrate and laterally between a second semiconductive pillar and a third semiconductive pillar, the first pillar being closer to the second pillar than to the third pillar, thus, providing a first recess between the first and second pillars and a wider second recess between the first and third pillars;
    forming a gate insulator over opposing sidewalls of the first pillar within the first and second recesses;
    forming a transistor front gate and a transistor back gate over the gate insulator and over respective opposing sidewalls of the first pillar by blanket depositing a conformal layer of gate conductor material within the first and second recesses and anisotropically etching the gate conductor material such that residual gate conductor material substantially fills the first recess, forming the back gate, and only partially fills the second recess, forming the front gate, the conformal layer having a pre-etching thickness that approximately equals a distance between the first and second pillar;
    covering any exposed portion of the front gate and the back gate with an element isolation material formed within the second recess between the front gate and the third pillar and elevationally above the front gate and the back gate; and
    forming a second transistor source/drain elevationally above the first source/drain and providing a transistor channel in the first pillar, the channel being operationally associated with the first and second sources/drains and with the front and back gates to form a vertical transistor configured to exhibit a floating body effect.

11. The method of claim 10 wherein forming the gate insulator comprises growing an oxide on the opposing sidewalls of the pillar and on the first source/drain within the first and second recesses.

12. The method of claim 10 wherein the element isolation material comprises a nitride.

13. The method of claim 10 further comprising forming a front word line and a back word line respectively including the front gate and the back gate, the front and back word lines operationally extending to other similarly formed vertical transistors in an array of transistors.

14. The method of claim 10 further comprising forming another similarly formed vertical transistor, the vertical transistor and the other vertical transistor sharing the back gate.

15. The method of claim 10 further comprising forming an array of capacitorless memory cells including the vertical transistor.

16. The method of claim 15 further comprising forming a computer system including the memory cells.

17. A method of forming a vertical transistor comprising:
forming first, second, and third linearly aligned semiconductive pillars by etching a monocrystalline silicon substrate, the first pillar being elevationally above a common first N+ transistor source/drain in the substrate and laterally between the second pillar and the third pillar, the first pillar being closer to the second pillar than to the third pillar, thus, providing a first recess between the first and second pillars and a wider second recess between the first and third pillars with the common first source/drain forming bottoms of the first and second recesses;
the etching also providing a fourth pillar adjacent the first pillar in a direction perpendicular to the linear alignment, a third recess existing between the first and fourth pillars;
forming oxide-containing element isolation material elevationally above the pillar and within the third recess;
forming a gate insulator over opposing sidewalls of the first pillar within the first and second recesses and over the bottoms of the first and second recesses, but not elevationally above the first pillar, by leaving the oxide-containing isolation in place;
forming a transistor front gate and a transistor back gate over the gate insulator and over respective opposing sidewalls of the first pillar by blanket depositing a conformal layer of gate conductor material within the first and second recesses and anisotropically etching the gate conductor material such that residual gate conductor material substantially fills the first recess, forming the back gate, and only partially fills the second recess, forming the front gate, the conformal layer having a pre-etching thickness that approximately equals a distance between the first and second pillar;
covering any exposed portion of the front gate and the back gate with nitride-containing element isolation material formed within the second recess between the front gate and the third pillar and elevationally above the front gate and the back gate;
using oxide-selective etching, forming a self-aligned contact opening through the oxide-containing isolation above the pillar, the opening exposing a portion of the first pillar; and
forming a second N+ transistor source/drain elevationally above the first source/drain and providing a transistor channel in the first pillar, the channel being operationally associated with the first and second sources/drains and with the front and back gates to form a vertical transistor configured to exhibit a floating body effect.

18. The method of claim 17 wherein forming the gate insulator comprises growing an oxide on the opposing sidewalls of the pillar and on the first source/drain within the first and second recesses.

19. The method of claim 17 further comprising forming a front word line and a back word line respectively including the front gate and the back gate, the front and back word lines operationally extending to other similarly formed vertical transistors in an array of transistors.

20. The method of claim 17 further comprising forming another similarly formed vertical transistor including the second pillar, the vertical transistor and the other vertical transistor sharing the back gate.

21. The method of claim 17 further comprising forming an array of capacitorless memory cells including the vertical transistor.

22. The method of claim 21 further comprising forming a computer system including the memory cells.

* * * * *

UNITED STATES PATENT AND TRADEMARK OFFICE
CERTIFICATE OF CORRECTION

PATENT NO.         : 7,410,856 B2
APPLICATION NO.  : 11/522144
DATED              : August 12, 2008
INVENTOR(S)        : Brown It is certified that error appears in the above-identified patent and that said Letters Patent is hereby corrected as shown below:

Column 3, lines 17-18 - Replace "of the pillar" with --of the first pillar--.

Column 3, line 20 - Replace "above the pillar" with --above the first pillar--.

Column 3, line 21 - Replace "above the pillar" with --above the first pillar--.

Column 3, line 29 - Replace "above the pillar" with --above the first pillar--.

Column 3, line 43 - Replace "above the pillar" with --above the first pillar--.

Column 3, line 44 - Replace "of the pillar" with --of the first pillar--.

Column 7, lines 12-13 - Replace "above the pillar" with --above the first pillar--.

Column 7, line 36 - Replace "above the pillar" with --above the first pillar--.

Column 7, line 44 - Replace "of the pillar" with --of the first pillar--.

Column 10, Claim 2, line 5 - Replace "of the pillar" with --of the first pillar--.

Column 10, Claim 3, line 8 - Replace "above the pillar" with --above the first pillar--.

Column 11, Claim 11, line 3 - Replace "of the pillar" with --of the first pillar--.

Column 11, Claim 17, line 36 - Replace "above the pillar" with --above the first pillar--.

UNITED STATES PATENT AND TRADEMARK OFFICE
CERTIFICATE OF CORRECTION

PATENT NO.        : 7,410,856 B2
APPLICATION NO.   : 11/522144
DATED             : August 12, 2008
INVENTOR(S)       : Brown It is certified that error appears in the above-identified patent and that said Letters Patent is hereby corrected as shown below:

Column 12, Claim 17, line 17 - Replace "above the pillar" with --above the first pillar--.

Column 12, Claim 18, line 27 - Replace "of the pillar" with --of the first pillar--.

Signed and Sealed this

Fourteenth Day of April, 2009

JOHN DOLL
*Acting Director of the United States Patent and Trademark Office*